United States Patent
Kom et al.

(10) Patent No.: US 11,237,605 B2
(45) Date of Patent: Feb. 1, 2022

(54) SYSTEM AND METHOD FOR COOLING COMPUTING DEVICES

(71) Applicant: CORE SCIENTIFIC, INC., Bellevue, WA (US)

(72) Inventors: Lawrence Kom, Redmond, WA (US); Thomas Fuller, Seattle, WA (US)

(73) Assignee: Core Scientific, Inc., Bellevue, WA (US)

(*) Notice: Subject to any disclaimer, the term of this patent is extended or adjusted under 35 U.S.C. 154(b) by 0 days.

(21) Appl. No.: 16/879,564

(22) Filed: May 20, 2020

(65) Prior Publication Data
US 2021/0368654 A1    Nov. 25, 2021

(51) Int. Cl.
*G06F 1/20*     (2006.01)
*H05K 7/20*     (2006.01)
*F04D 15/00*    (2006.01)

(52) U.S. Cl.
CPC ......... *G06F 1/206* (2013.01); *H05K 7/20736* (2013.01); *F04D 15/0066* (2013.01)

(58) Field of Classification Search
CPC .. G06F 1/206; H05K 7/20736; F04D 15/0066
USPC ........................................................ 700/299
See application file for complete search history.

(56) References Cited

U.S. PATENT DOCUMENTS

| | | | |
|---|---|---|---|
| 6,791,836 B2 | 9/2004 | Cipolla et al. | |
| 9,188,355 B1 | 11/2015 | Allen et al. | |
| 9,883,009 B2 * | 1/2018 | Hamann | H04L 67/42 |
| 10,085,358 B2 | 9/2018 | Adiletta et al. | |
| 10,317,105 B2 | 6/2019 | Hopkins et al. | |
| 2004/0004813 A1 | 1/2004 | Coglitore et al. | |
| 2006/0139877 A1 | 6/2006 | Germagian et al. | |
| 2014/0240919 A1 * | 8/2014 | Alshinnawi | H05K 7/20145 361/679.49 |
| 2015/0030469 A1 | 1/2015 | Hopkins et al. | |

(Continued)

FOREIGN PATENT DOCUMENTS

CN       206001640    *   3/2017

OTHER PUBLICATIONS

International Search Report and Written Opinion related to corresponding International Patent Application PCT/US2021/032559.

(Continued)

*Primary Examiner* — Chun Cao
(74) *Attorney, Agent, or Firm* — Fishman Stewart PLLC

(57) ABSTRACT

Systems and methods for cooling large numbers of computing devices in a data center are disclosed. The computing devices have cooling fans that can have their fan speed set by management instructions. The devices are mounted in racks in a two-dimensional array and connected via network switches with ports corresponding to their location in the racks. The computer devices are oriented so that their cooling fans all exhaust waste heat to one side of the rack. Instructions are sent to the computing devices to set one or more attributes such as fan speed, operating frequency and voltage according to one ore more patterns. The patterns can be linear or nonlinear and can be shifted, rotated, or changed over time periodically or based on temperature or other performance measurements from the computing devices.

18 Claims, 9 Drawing Sheets

(56) References Cited

U.S. PATENT DOCUMENTS

| | | | |
|---|---|---|---|
| 2015/0049431 A1* | 2/2015 | Kondo | C09K 5/041 |
| | | | 361/679.47 |
| 2016/0037676 A1 | 2/2016 | Gaal | |
| 2016/0309621 A1* | 10/2016 | Chen | H05K 7/20836 |
| 2020/0042054 A1 | 2/2020 | Papen et al. | |

OTHER PUBLICATIONS

Moreau et al. "Effect of airfoil aerodynamic loading on trailing edge noise sources." AIAA 1-23 journal 43.1 (2005) 41-52. Jan. 2005 (Jan. 2005) Retrieved on Jul. 13, 2021 (Jul. 13, 2021) from https://arc.aiaa.org/doi/abs/10.2514/1.5578.

* cited by examiner

SYSTEM AND METHOD FOR COOLING COMPUTING DEVICES

TECHNICAL FIELD

The present disclosure generally relates to the field of computing and, more particularly, to systems and methods for cooling large numbers of computing devices in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Data centers housing large numbers of miners or other CPU- or GPU-based systems used for compute intensive workloads in particular (e.g., rendering, AI, machine learning, data science) may face cooling issues. This is due to the significantly higher density, power usage, heat generation, and duty cycle common to these device and workloads.

The heat in these data centers can exceed the cooling ability of a computing device's built-in fans, which force air across heat sinks on the computing device in order to extract and exhaust the waste heat. Traditional methods for improving cooling of computing devices in data centers include adding additional large external fans to increase airflow across the computing devices and using external cooling units that reduce the temperature of the air that is forced across the computing device by its built-in cooling fans. These methods have a significant drawback in that they use significant amounts of energy on top of the energy already used by the computing devices themselves.

Furthermore, even with these additional cooling methods, hot spots often occur within certain locations in data centers. For example, some compute devices farthest away from the data center's exhaust vents may see reduced airflow and therefore suffer from reduced cooling.

For at least these reasons, there is a desire for a solution to allow for improved efficient cooling of computing devices in a data center.

SUMMARY

An improved system and method for cooling a plurality of computing devices in a data center is contemplated. In one embodiment, the method comprises configuring the plurality of computing devices in a plurality of racks, with each computing device configured to exhaust heat in the same direction that is parallel to the other computing devices on the rack. Instructions are sent to the computing devices to set the computing devices' fan speed in a pattern. For example, the pattern may be linear or nonlinear, e.g., a ramp function or a gradient pattern in one or more directions (e.g. a two-dimensional linear gradient). The gradient pattern may be lower for the computing devices nearer to an exhaust opening and higher for devices farther from an exhaust opening. In some embodiments, the racks may be parallel to each other and exhaust in opposing directions, with the space between the racks bound by impermeable barriers and an exhaust port to funnel exhaust heat out. For example, the gradient pattern may be lower for the computing devices at one end of a rack (near a side exhaust opening) and higher for the computing devices at the other end, or it may be lower for computing devices at the top of a rack (near a top exhaust opening) and higher for devices at the bottom of the rack. Managing device settings such as fan speeds by patterns based for example on the physical location of the computing devices may improve cooling efficiency and ease of management.

A method for managing a data center housing a plurality of computing devices in a plurality of racks and connected via one or more network switches is also contemplated. In one embodiment, each switch may have a plurality of network ports, with each port associated with a different physical device location within the racks. In one embodiment the method may comprise sending instructions to set the fan speed of the computing devices in a pattern based on each computing device's location within the racks (as determined by its network port). The pattern may for example be a linear or non-linear gradient, one or two-dimensional, and may shift, rotate or change over time. Different patterns from a set of predefined patterns may be periodically selected and applied to the computing devices by sending updated management instructions to set the fan speed of the computing devices according to the newly changed or selected pattern. In addition, or in place of fan speed instructions, instructions to set other operating parameters such as operating frequency and or voltage according to a pattern may also be sent to the devices (e.g., with the highest desired frequency sent to devices nearest the exhaust opening, and the lowest desired frequencies sent to devices farthest from the exhaust opening, with a linear gradient being applied to the devices between).

A system for cooling computing devices in a data center is also contemplated. In one embodiment, the system may comprise one or more racks configured to support large numbers of computing devices in a two-dimensional array, with the computing devices each having one or more cooling fans configured to direct exhaust in a first direction perpendicular to the racks on which they are positioned. A control module such as a management computer running a management application may be connected to the computing devices via a network, and the control module may be configured to dispatch management instructions such as cooling fan speed setting instructions to the computing devices in a pattern (e.g. a one or two-dimensional gradient) that can shift, rotate, or change over time.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
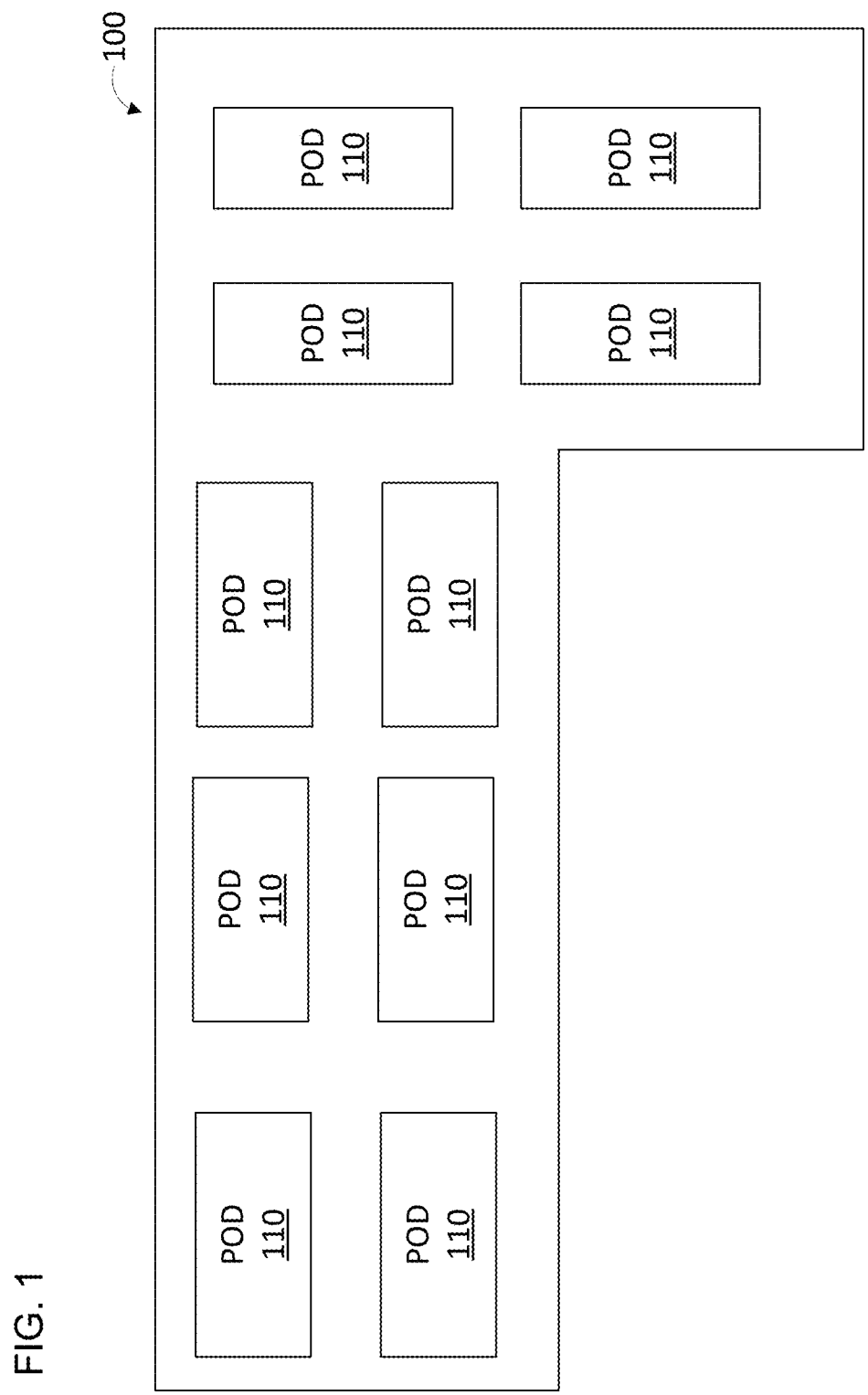
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned at one end of each pod or above the center of each pod) to capture the hot waste air and then discharge it out of the data center via vents in the roof of the data center.

Figure 2:
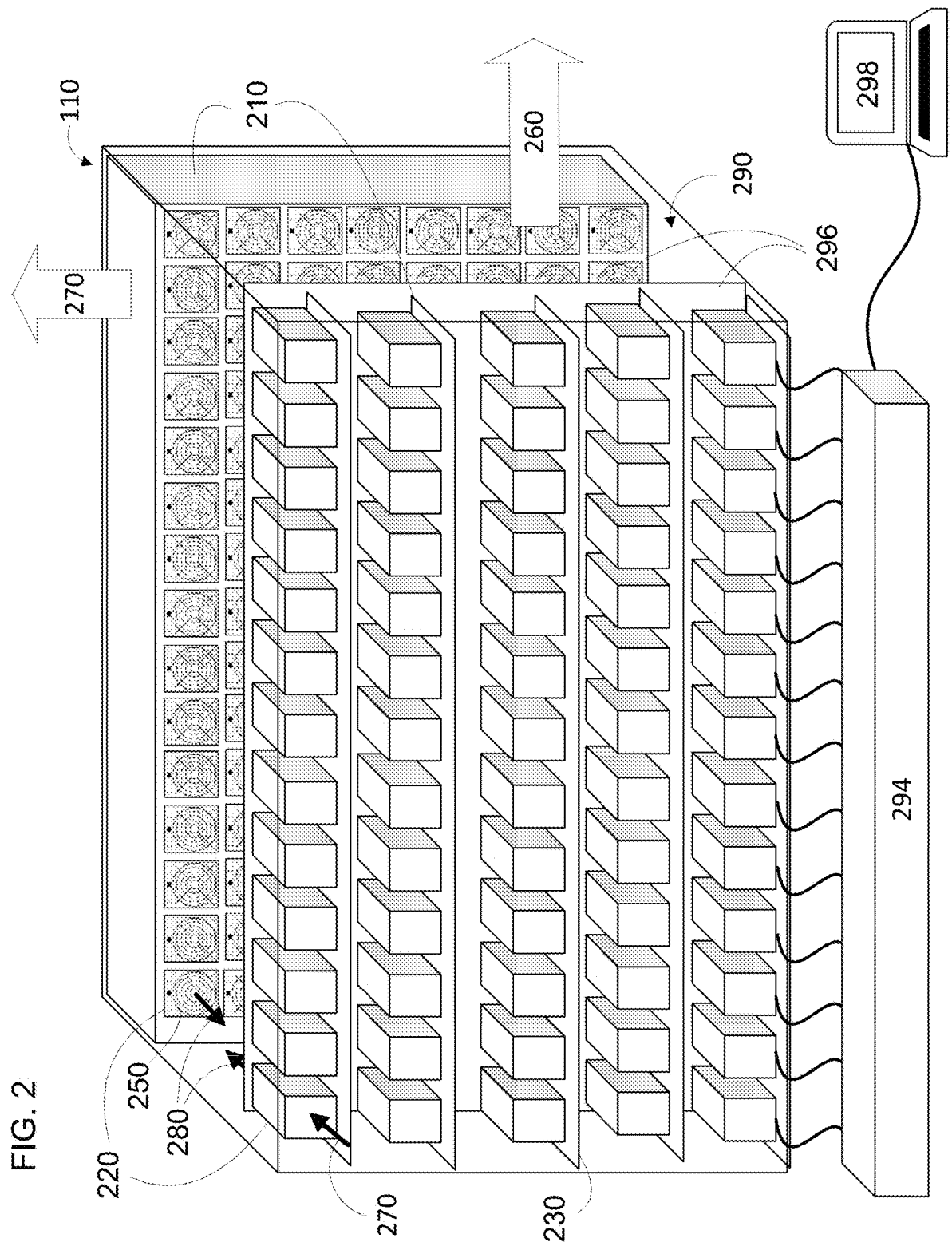
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used within computing device 220. Heated air is exhausted by computing devices 220 into the space 290 between racks 210, often called a hot aisle. The space between racks 210 is typically sealed except for one or more exhaust openings through which the heated air exits. In some embodiments, these openings may be at the side, with heated air exiting as indicated by arrow 260. In other embodiments, these exhaust openings may be located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information) and results of the computing jobs to be returned. Switch 294 may also be connected to other networks such as the internet, as well as a management computer 298 that is configured to execute a management application to manage computing devices 220. Management computer 298 may be a traditional PC or server, or specialized appliance. Management server 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management computer 298 as a stand-alone software package, partly on the management computer 298 and partly on a remote computer or computing devices 220, or entirely on a remote computer or computing devices 220.

In order to better cool computing devices 220, the management application may be configured to dispatch instructions to computing devices 220 setting their fan speeds according to one or more predetermined patterns as described in greater detail below. While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of pattern (e.g., linear gradient or cubic). With this information the management application may then automatically calculate the values (e.g., fan speed settings) for each computing device based on the distribution of the computing devices on the rack. In another embodiment, the management application may prompt the user to fill in one or more grids (as shown for example in FIG. 7) with values for each pattern. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

Figure 3:
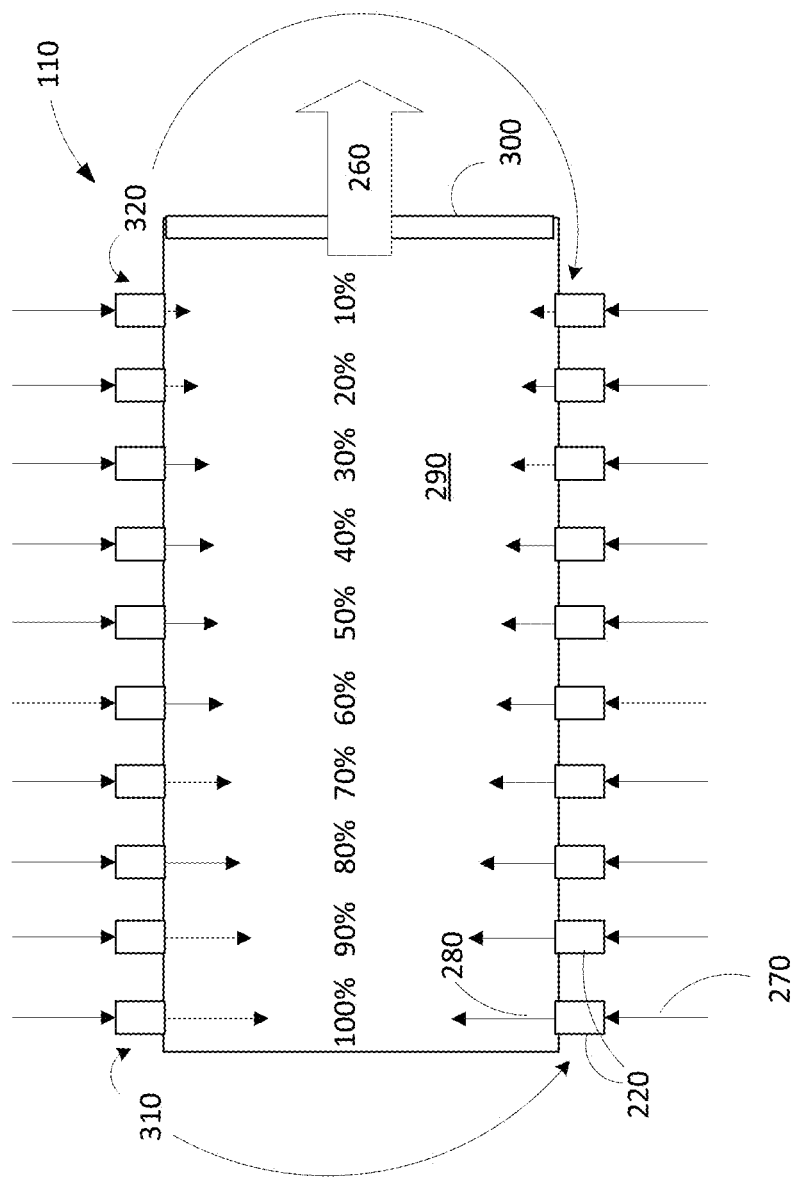
FIG. 3 is a top view of an example embodiment of a system for cooling computing devices in a data center according to the teachings of the present disclosure.

Turning now to FIG. 3, a top down view of an example embodiment of a system for cooling computing devices 220 in a pod 110 in a data center is shown. In this example, computing devices 220 exhaust hot air into hot aisle 290, which is sealed to prevent the hot air from exiting except through exhaust opening 300, as illustrated by arrow 260. To more efficiently and better cool computing devices 220, instructions are sent to computing devices 220 setting their fan speeds according to a pattern. In this example, the pattern starts at maximum fan speed (100%) for computing devices that are farthest from the exhaust opening. In this example, those devices are in columns 310. The pattern then reduces the fan output slightly (e.g., by 10%) for computing devices 220 in each neighboring column, reaching a predetermined minimum fan space (e.g., 10%) for the computing devices in columns 320, which are nearest to the exhaust opening 300.

Figure 4:
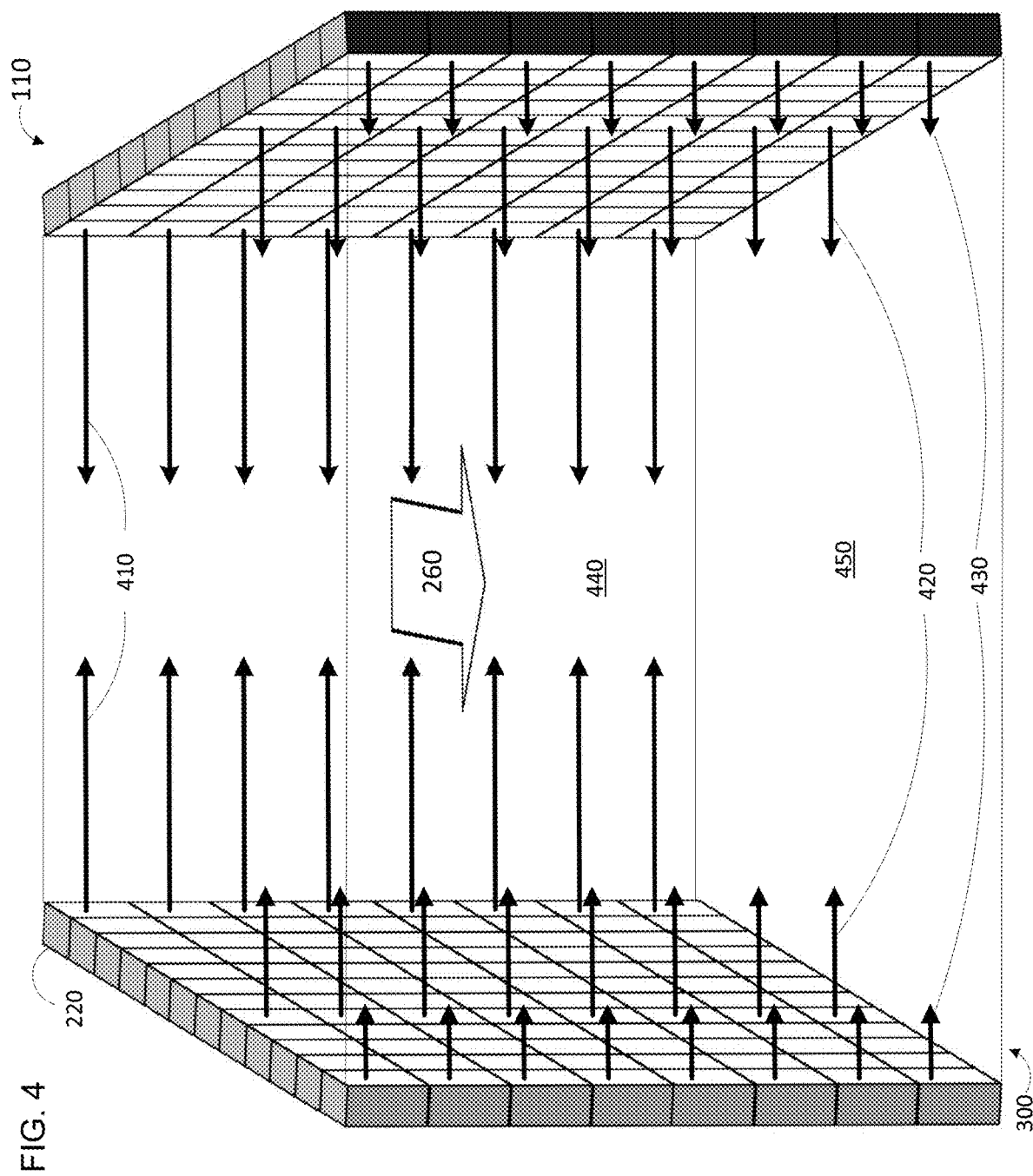
FIG. 4 is a perspective view of an example embodiment of a fan cooling pattern applied to an example pod in a data center according to the teachings of the present disclosure.

Turning now to FIG. 4, a perspective view of the example embodiment from FIG. 3 is shown with each cube representing a computing device 220 and arrows indicating the approximate direction of exhaust and relative fan speed. The top, back 440, and floor 450 of the space between the racks of computing devices 220 are sealed, with one side being open as an exhaust opening 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each column that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is from the back to the front and out the exhaust opening 300 as indicated by arrow 260.

Figure 5:
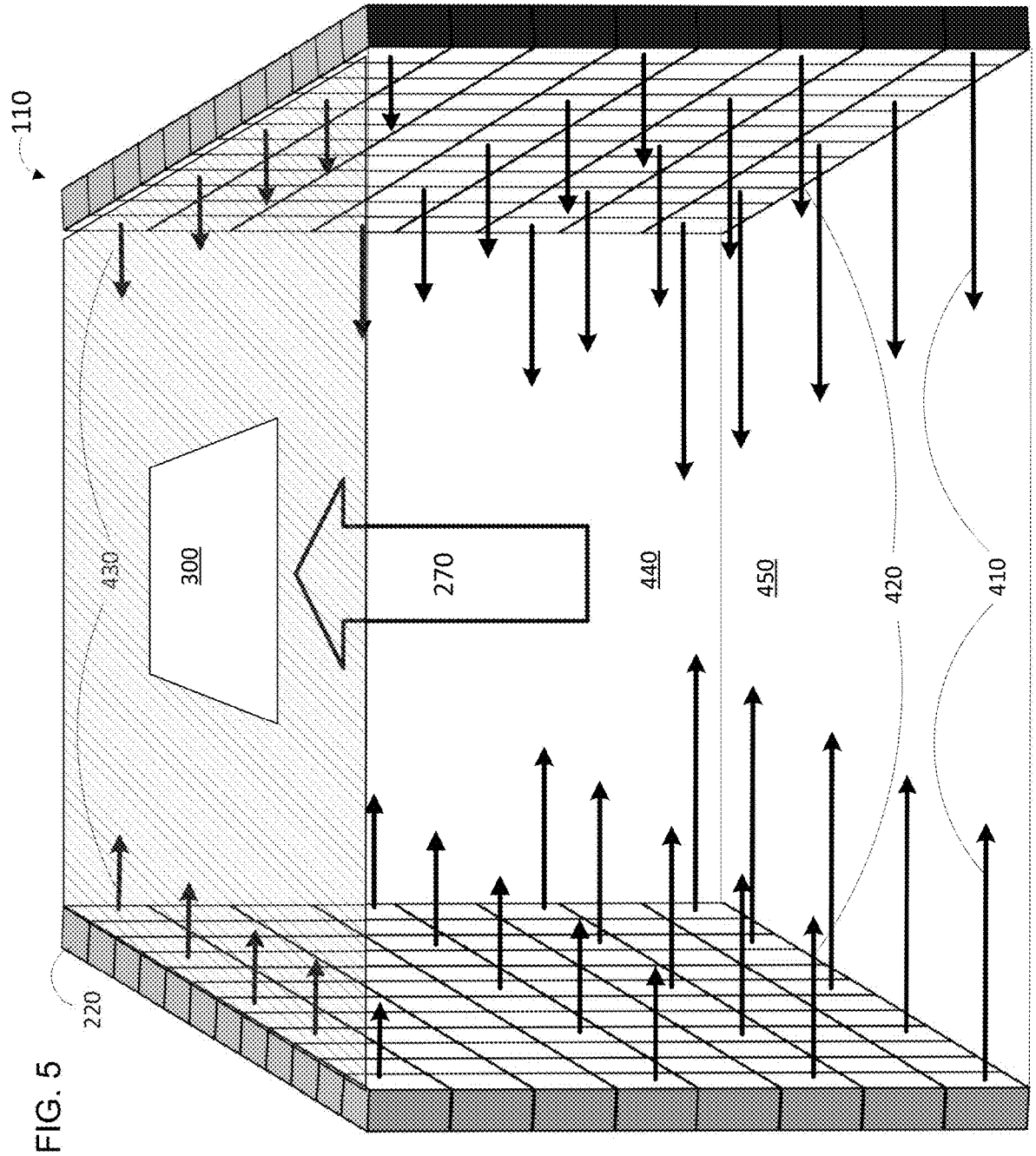
FIG. 5 is another perspective view of another example embodiment of a fan cooling pattern applied to an example pod in a data center according to the teachings of the present disclosure.

Turning now to FIG. 5, a perspective view of another example embodiment of a fan cooling pattern applied to an example pod in a data center is shown. As with the previous example, each cube represents a computing device 220, and arrows indicate the approximate direction and relative air/fan speed. The front, back 440, and floor 450 of the space between the racks of computing devices 220 are sealed, with the top having one or more exhaust openings 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each row that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is bottom up and out the exhaust opening 300 as indicated by arrow 270. While linear gradient patterns have been illustrated, the pattern or gradient applied can be linear or nonlinear (e.g. exponential, cubic, quadratic). The pattern can also vary in two dimensions, as illustrated in the next example.

Figure 6:
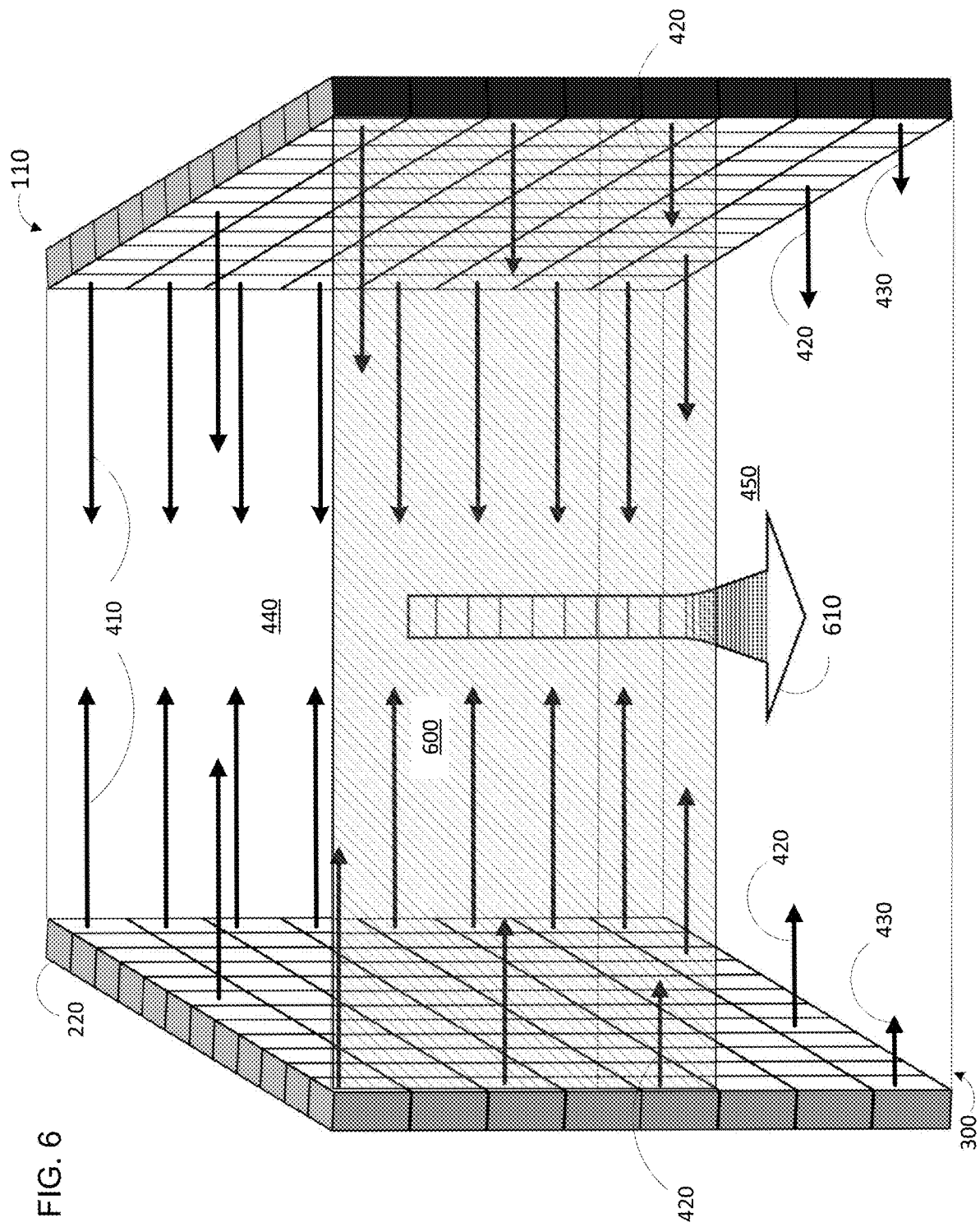
FIG. 6 is another perspective view of an example embodiment of a fan cooling pattern applied to an example pod in a data center according to the teachings of the present disclosure.

Turning now to FIG. 6, a perspective view of another example embodiment of a fan cooling pattern applied to an example pod in a data center is shown. As with the previous example, each cube represents a computing device 220, and arrows indicate the approximate direction and relative air/fan speed. The ceiling, back 440, and floor 450 of the space between the racks of computing devices 220 are sealed, with part of the front being sealed by barrier 600 and part being an exhaust opening 300. The pattern of fan settings applied to computing devices 220 is a two-dimensional gradient in this example embodiment, with fan speed being lowest for computing devices 220 that are closest to the exhaust vent 300 (as indicated by arrows 430), then gradually increasing for computing devices 220 that are farther away from the exhaust opening 300 (as indicated by arrows 420) until the highest fan speed settings are applied to the computing devices 220 that are farthest from the exhaust opening 300 (as indicated by arrows 410). The general direction of exhaust airflow is down and out the exhaust opening 300 as indicated by arrow 610. Exhaust openings are generally preferably positioned higher because the heated air naturally rises, but limitations in the building used for the particular data center may dictate other positions like the one illustrated.

Figure 7:
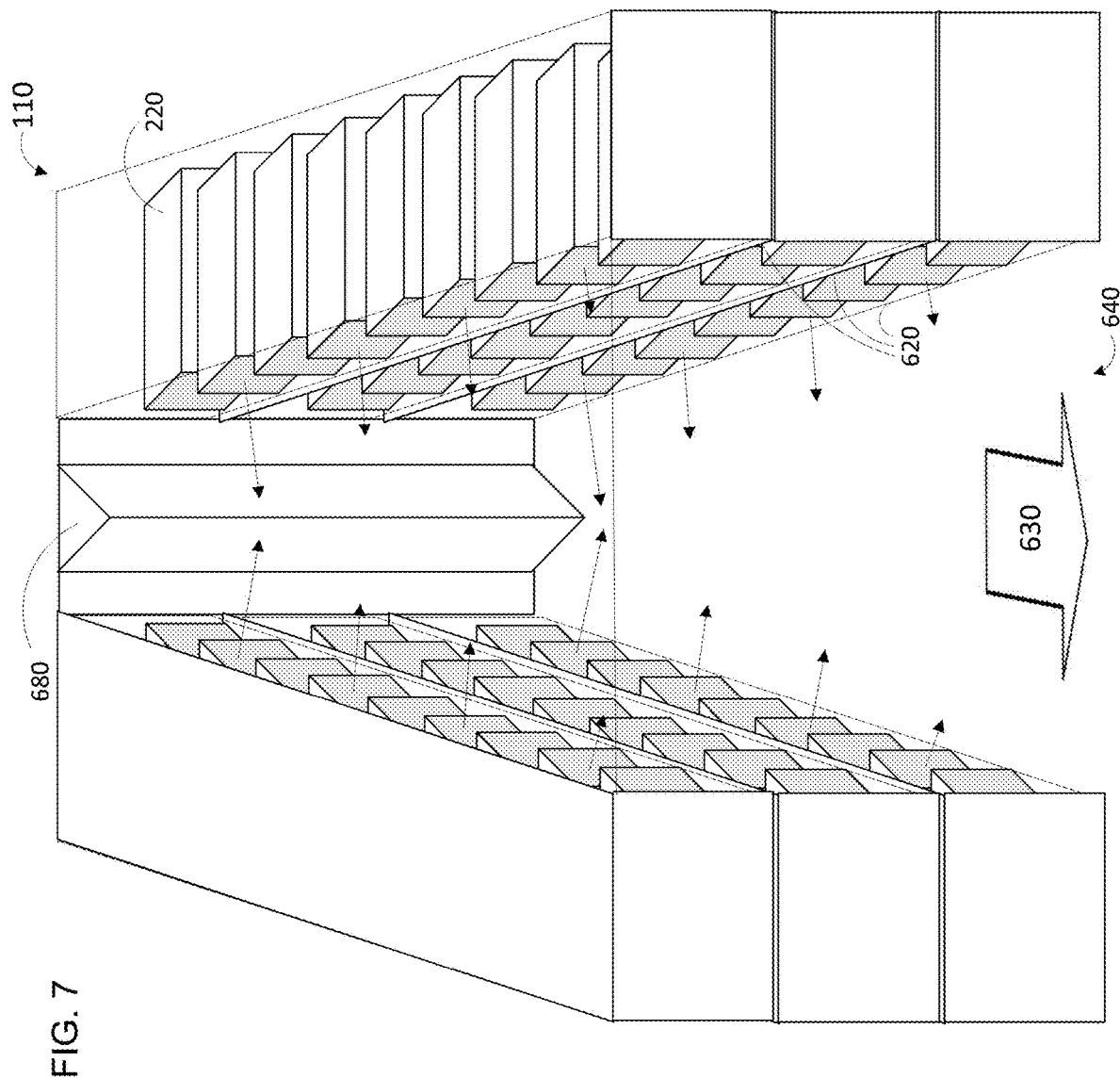
FIG. 7 is another perspective view of an example embodiment of a fan cooling pattern applied to an example pod in a data center according to the teachings of the present disclosure.

Turning now to FIG. 7, an illustration of another example embodiment of a system for cooling devices in a data center is shown. In this example embodiment, each computing device 220 is positioned so as direct exhaust heat at an angle (i.e., not perpendicular to the shelves 620). This angle may be substantially consistent across all computing devices 220, or the angle may gradually increase the closer the computing devices are to the exhaust opening 640. This angle contributes to the airflow out the exhaust opening 640, as indicated by arrow 630. In some embodiments, there may also be one or more air deflectors 680 positioned between the opposing racks in pod 110. Air deflectors 680 may be used to compensate for obstructions (e.g., pillars) within the pod and may be angled to direct exhaust air toward exhaust opening 640.

Figure 8:
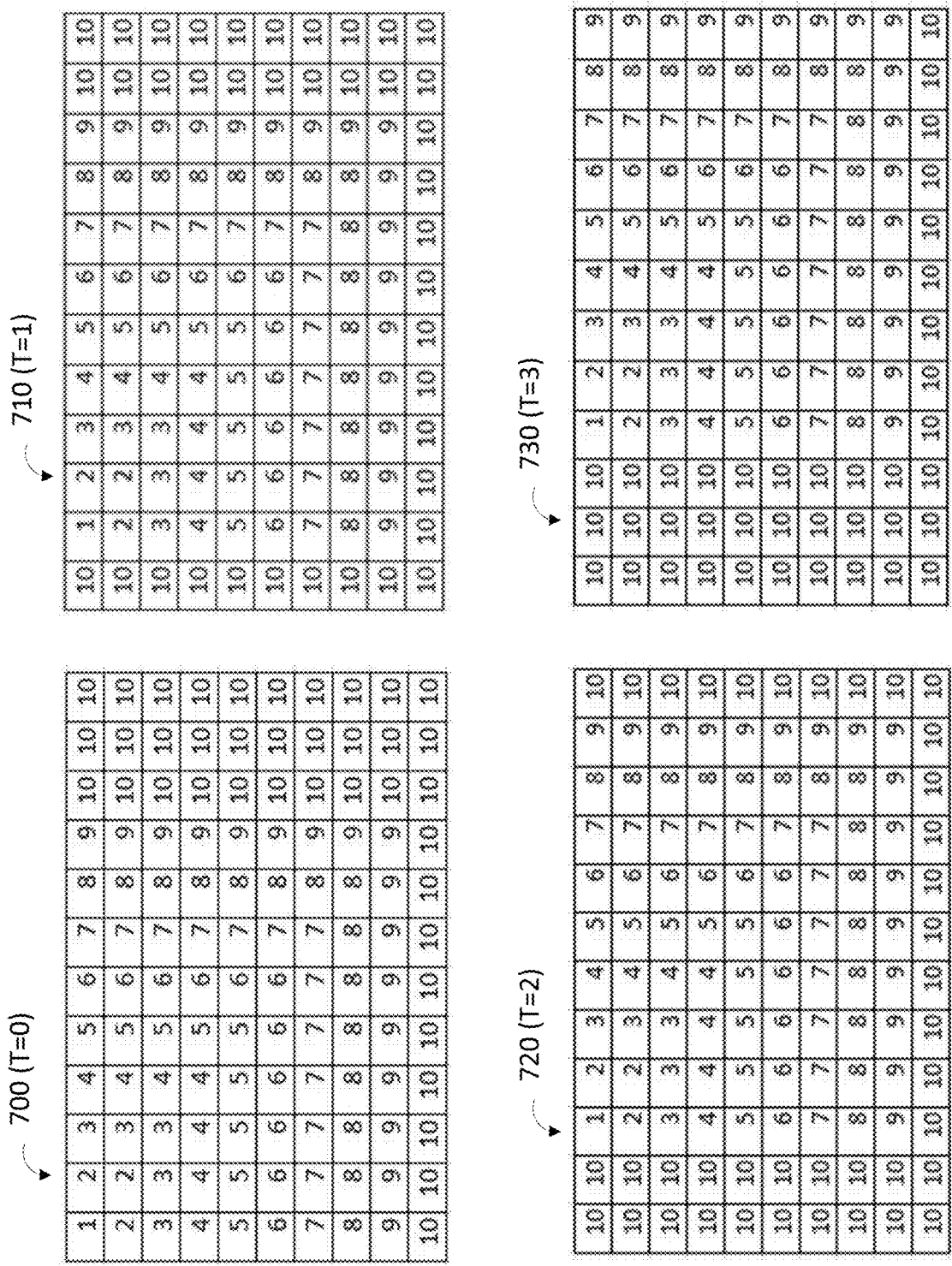
FIG. 8 is an illustration of an example embodiment of a pattern for fan power settings according to the teachings of the present disclosure.

Turning now to FIG. 8, an illustration of an example embodiment of a pattern for fan power settings is shown. In this embodiment, each cell represents a percentage of maximum fan speed, for example with 10 representing 100% of the computing device's maximum fan speed, 9 representing 90% of the computing device's maximum fan speed, and so on. In this embodiment, the pattern changes over time, with pattern 700 being a first pattern sent to the computing devices on a rack at a starting time T=0, pattern 710 being a second pattern sent to the same computing devices at a later time T=1, pattern 720 being a third pattern sent to the same computing devices at a still later time T=3, and pattern 730 being a fourth pattern sent to the same computing devices at a later time T=4.

In some embodiments, the pattern may be periodically shifted and or rotated and resent to the computing devices as shown. This coordinated dynamic changing of fan speeds may beneficially be used to prevent static areas with reduced air flow that may build up heat and create hot spots in the rack, pod, or data center. The pattern shifting may be horizontal, vertical, or some combination thereof. In some embodiments, entirely different patterns may be applied at different times to the computing devices instead of, or in combination with, shifting and or rotating a single pattern.

In some embodiments, the pattern may comprise not only fan settings, but a combination of fan settings and one or more other operating settings for the computing devices (e.g., voltage levels and operating frequencies) that also impact the heat generation and cooling of the computing device.

Figure 9:
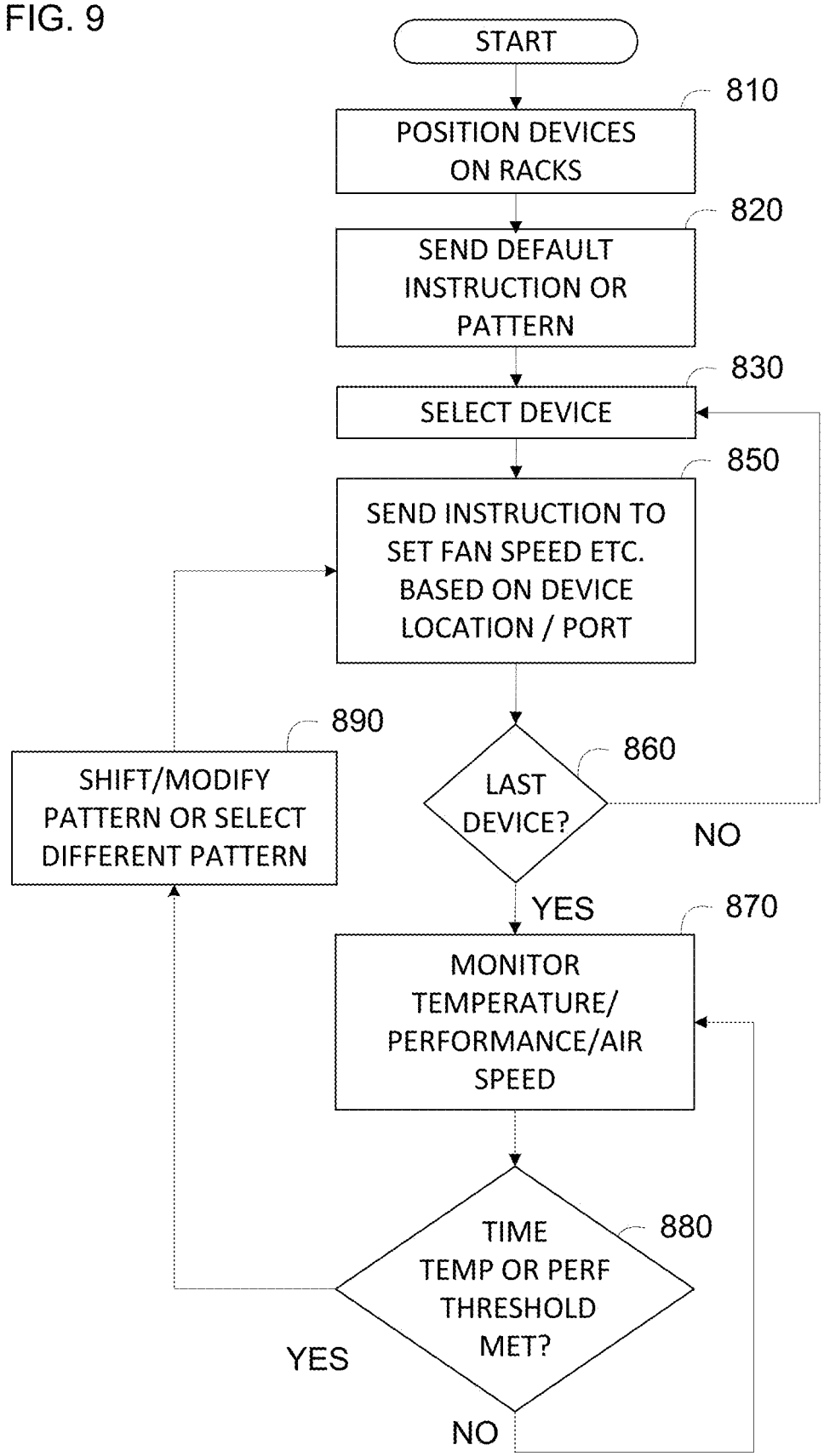
FIG. 9 is a flow chart of an example embodiment of a method for cooling computing devices in a data center according to the teachings of the present disclosure.

Turning now to FIG. 9, a flow chart of an example embodiment of a method for cooling computing devices in a data center according to the teachings of the present disclosure is shown. This method may for example be implemented in software as a management application executing on a management computer that manages the computing devices in the data center. In the embodiment illustrated in the figure, the computing devices are positioned on racks (step 810), and a default instruction that sets an initial pattern is sent (step 820). The instruction is applied to the computing devices by selecting each device (step 830) and sending the appropriate management instruction or instructions to the device (step 850). The management instructions may set the fan speed to a particular value (e.g., percentage of maximum fan speed, tachometer or rotations per minute (RPM) setting, a pulse width modulation (PWM) setting such as duty cycle), or device voltage level or operating frequency, or some combination thereof. Depending on the computing devices being managed, this may be accomplished in a number of different ways, for example via SSH, TCP/IP, HTTP or other network protocol. This is repeated for each device until the last device is set (step 860). The temperature and/or performance of the computing devices is monitored (step 870), and if any thresholds are met such as a maximum desired temperature or performance below a certain threshold (step 880), a new pattern may be selected, or a pattern shift, change, or sequence of shifts/changes may be triggered (step 890). In addition to temperature in the computing device, temperature at various locations in the data center may be measured via network-enable thermometers, and the airspeed of air through or near the computing devices may be monitored (step 870) by reading a speed value from one or more tachometers connected to one or more of the computing devices fans, or by reading values from one or more network-connected airspeed detectors placed at measuring locations within the hot aisle(s) of the data center.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for cooling a plurality of computing devices, the method comprising:
    positioning the plurality of computing devices on one or more racks in a two-dimensional array, wherein each of the computing devices on each of the racks has at least one fan and is configured to exhaust heat in the same direction; and
    sending, via a management computer connected to the computing devices via an electronic communication network, instructions to set the fan speed of the fans of the computing devices in a gradient pattern across the two-dimensional array;
    wherein the gradient pattern includes fan speeds that vary according to positions of the computing devices relative to an exhaust opening.

2. The method of claim 1, wherein the computing devices are disposed in a plurality of columns, each column including a set of the computing devices; and
    the gradient pattern is a one-dimensional ramp function such that the fan speed is highest for the computing devices in the columns farthest from the exhaust opening and decreases for each neighboring column toward the exhaust opening.

3. The method of claim 1, wherein the gradient pattern is lower for the computing devices at a top of the one or more racks and higher for the computing devices at a bottom of the one or more racks.

4. The method of claim 1, wherein each rack has a first end and a second end, wherein the gradient pattern is lower for the computing devices at the first end and higher for the computing devices at the second end; and the gradient pattern includes fans speeds for the computing devices disposed between the first end and the second end that increase from the first end to the second end.

5. The method of claim 1, wherein the gradient pattern is higher for computing devices farthest from the exhaust opening and lower for computing devices closer to the exhaust opening.

6. The method of claim 1, wherein the gradient pattern changes horizontally and vertically such that fan speeds are higher for lower computing devices and computing devices that are farther from the exhaust opening horizontally.

7. The method of claim 1, further comprising periodically sending, via the management computer, new instructions that apply a different gradient pattern from a set of predefined gradient patterns.

8. The method of claim 1, further comprising:
    reading, via the management computer, a speed value from a tachometer on each computing device, and
    adjusting the gradient pattern based on the speed value.

9. The method of claim 1, further comprising:
    periodically measuring the temperature of the computing devices; and
    sending, via the management computer, updated fan speed instructions to the computing devices according to a second two-dimensional pattern that is different from the gradient pattern in response to one or more of the measured temperatures exceeding a predetermined threshold.

10. The method of claim 9, wherein the first gradient pattern and second pattern are linear gradients.

11. The method of claim 9, wherein the first gradient pattern and second pattern are nonlinear gradients.

12. The method of claim 9, wherein the second pattern is a horizontal or vertical shift of the first gradient pattern.

13. The method of claim 9, further comprising:
    reading one or more speed values from one or more tachometers within the computing devices, and
    adjusting the second pattern based on the speed values.

14. The method of claim 9, further comprising:
    reading one or more airflow values from one or more network-enabled airflow measurement devices external to the computing devices positioned within a data center, and adjusting the second pattern based on the airflow values.

15. The method of claim 9, further comprising:
    reading one or more temperatures from one or more of the plurality of computing devices and
    adjusting the second pattern based on the temperatures.

16. The method of claim 9, further comprising:
    reading one or more temperatures from one or more network enabled temperature sensors within a data center, and
    adjusting the second pattern based on the temperatures.

17. A method for cooling a plurality of computing devices, the method comprising:
    positioning the plurality of computing devices on one or more racks in a two-dimensional array, wherein each of the computing devices on each of the racks has at least one fan and is configured to exhaust heat in the same direction;
    sending, via a management computer connected to the computing devices via an electronic communication network, instructions to set the fan speed of the fans of the computing devices in a fan speed gradient pattern across the two-dimensional array; and sending, via the management computer, instructions to set an operating frequency and voltage for the computing devices in a gradient pattern.

18. The method of claim 17, wherein the gradient pattern includes higher frequencies for the computing devices disposed proximate an exhaust opening and lower for the computing devices disposed farther from the exhaust opening changes vertically.

\* \* \* \* \*